(12) United States Patent
Ramaswamy et al.

(10) Patent No.: US 7,262,658 B2
(45) Date of Patent: Aug. 28, 2007

(54) CLASS-D AMPLIFIER SYSTEM

(75) Inventors: Srinath Mathur Ramaswamy, Dallas, TX (US); Jagadeesh Krishnan, Dallas, TX (US); Gangadhar Burra, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 69 days.

(21) Appl. No.: 11/193,867

(22) Filed: Jul. 29, 2005

(65) Prior Publication Data
US 2007/0024365 A1   Feb. 1, 2007

(51) Int. Cl.
*H03F 3/217* (2006.01)

(52) U.S. Cl. ............. 330/251; 330/10; 330/207 A
(58) Field of Classification Search ........... 330/251, 330/10, 207 A
See application file for complete search history.

(56) References Cited

U.S. PATENT DOCUMENTS

| | | | |
|---|---|---|---|
| 6,097,249 A | | 8/2000 | Strickland et al. |
| 6,741,123 B1 * | | 5/2004 | Andersen et al. ............. 330/10 |
| 6,794,930 B1 * | | 9/2004 | Nurminen ..................... 330/10 |
| 6,819,177 B2 | | 11/2004 | Ruha et al. |
| 6,922,100 B2 * | | 7/2005 | Midya et al. ................. 330/10 |
| 6,998,910 B2 * | | 2/2006 | Hezar et al. .................. 330/10 |
| 7,058,464 B2 * | | 6/2006 | Mallinson ..................... 700/94 |
| 7,102,426 B2 * | | 9/2006 | Kitamura ..................... 330/10 |

* cited by examiner

*Primary Examiner*—Patricia Nguyen
(74) *Attorney, Agent, or Firm*—William B. Kempler; W. James Brady; Frederick J. Telecky, Jr.

(57) ABSTRACT

A Class-D amplifier system may include an input stage that includes an $N^{th}$ order filter, where $N>1$. The input stage filters an input signal to provide a filtered output signal, an input of the input stage being configured to receive the input signal as a digital pulse-width-modulated (PWM) signal. A comparator provides a quantized output signal based on the filtered output signal. An output stage is connected between a first voltage rail and a second voltage rail. The output stage provides a switching output signal at an output that varies between the first voltage rail and the second voltage rail based on the quantized output signal. A feedback path connects the output of the output stage with the input of the input stage, such that the $N^{th}$ order filter compensates for variations in at least one of the first voltage rail and the second voltage rail.

19 Claims, 5 Drawing Sheets

# CLASS-D AMPLIFIER SYSTEM

TECHNICAL FIELD

The present invention relates to electronic circuits, and more specifically, to a Class-D amplifier system, such as for use in an audio system.

BACKGROUND

As with most manufacturing businesses, the integrated circuit (IC) industry is driven by customer demands for lower cost solutions without having to sacrifice performance. In the IC industry, one way to reduce cost is to provide attractive solutions that meet existing needs with reduced die area. Of particular interest is the Class-D audio amplification area.

Various approaches exist to implement pulse width modulation (PWM). The pulse width modulation is obtained by taking a stream of pulses and varying their widths as a function of a control input. One form of PWM generation, which is called Natural-PWM (NPWM), involves comparing an analog input waveform with a triangle wave at a carrier frequency of $f_c$. The continuing expansion of digital techniques in the field of audio has led to a different form of PWM generation called Uniform-PWM (UPM), which typically uses a higher order digital modulator to convert a digital Pulse Coded Modulation (PCM) signal to a uniformly sampled PWM signal. In addition to using the sampling method as way to differentiate PWM methods, PWM methods can also be differentiated by the edge modulation and by the class of modulation. For example, Class-AD and Class-BD are standardized abbreviations used to differentiate between two-level and three-level switching. The modulation can also be single-sided or double-sided.

Once the PWM signal is generated, it can be used to drive a high power output FET array, such as a half bridge or an H-bridge. Due to the bi-level nature of the PWM signal for traditional Class-AD, each transistor will be either completely on or completely off. It is the operation of the transistors between on and off conditions that enables the power stage to achieve a much higher efficiency than other types of analog power stages.

Even for an ideal NPWM (and UPWM), a subsequent switching power stage will add noise and distortion due to switching delays that vary non-linearly with load current. The quality of the triangle wave signal can also induce errors. Similarly, noise and nipple on the power supply for the switching power stage will introduce errors in the system output signal resulting in poor Total Harmonic Distortion (THD) and Power Supply Rejection Ratio (PSRR). It is known from delta-sigma converter theory that using an integrator before a noise adding element and then feeding back the inverse of the output pushes the added errors high into the frequency band. If the errors are pushed above the audio band, an external lowpass filter can be used to extract the audio signal from the PWM waveform. The same principle has been used for many existing Class-D architectures. Most of the existing architectures for Class-D amplifiers, however, operate on analog inputs and hence require the presence of a digital-to-analog converter (DAC). Such approaches also require an analog ramp signal at the input of a comparator to generate the PWM output.

SUMMARY

The present invention relates generally to a Class-D amplifier system.

One aspect of the present invention provides an amplifier system that includes an input stage that includes an $N^{th}$ order filter, where N>1. The input stage filters an input signal to provide a filtered output signal, an input of the input stage being configured to receive the input signal as a digital pulse-width-modulated (PWM) signal. A comparator provides a quantized output signal based on the filtered output signal. An output stage is connected between a first voltage rail and a second voltage rail. The output stage provides a switching output signal at an output that varies between the first voltage rail and the second voltage rail based on the quantized output signal. A feedback path connects the output of the output stage with the input of the input stage, such that the $N^{th}$ order filter compensates for variations in at least one of the first voltage rail and the second voltage rail.

Another aspect of the present invention provides an audio amplifier system that includes an Nth order loop filter, where N>1, configured to integrate an error signal, which is functionally related to a difference between an input signal representing an audio signal and a feedback signal corresponding to an output signal of the audio amplifier system, the loop filter providing at least one corresponding integrated output signal. A comparator provides a quantized output signal based on the at least one corresponding integrated output signal. An output stage is connected between a first voltage rail and a second voltage rail. At least one of the first voltage rail and the second voltage rail is an unregulated voltage, the output stage modulating the output signal between the first voltage rail and the second voltage rail based on the quantized output signal. A load, such as one or more speakers, can be connected to receive the output signal for converting the output signal to an audible signal.

A system implemented according to an aspect of the present invention can run on a digital PWM input signal. This is advantageous as it greatly reduces the amount of die area by mitigating the requirement of utilizing a digital-to-analog converter (DAC) at the input. As a result, the cost of production and of implementation can be reduced relative to existing implementations. Additionally, the approach enables direct-to-battery connection for the output stage, which further obviates the need for power regulators or conditioning circuitry.

DETAILED DESCRIPTION

The present invention relates to a Class-D amplifier system that can accept digital Pulse Width Modulated (PWM) inputs. The amplifier employs an $N^{th}$ order loop filter, where N>1, to achieve high efficiency even when an output stage is directly connected to a battery. That is, the loop filter helps compensate for variations in the battery voltage, such as when an output stage is connected directly to the battery (e.g., the voltage used by the output stage is unregulated). The Class-D amplifier system, including the loop filter, further can be configurable to accept both analog and digital input signals.

Figure 1:
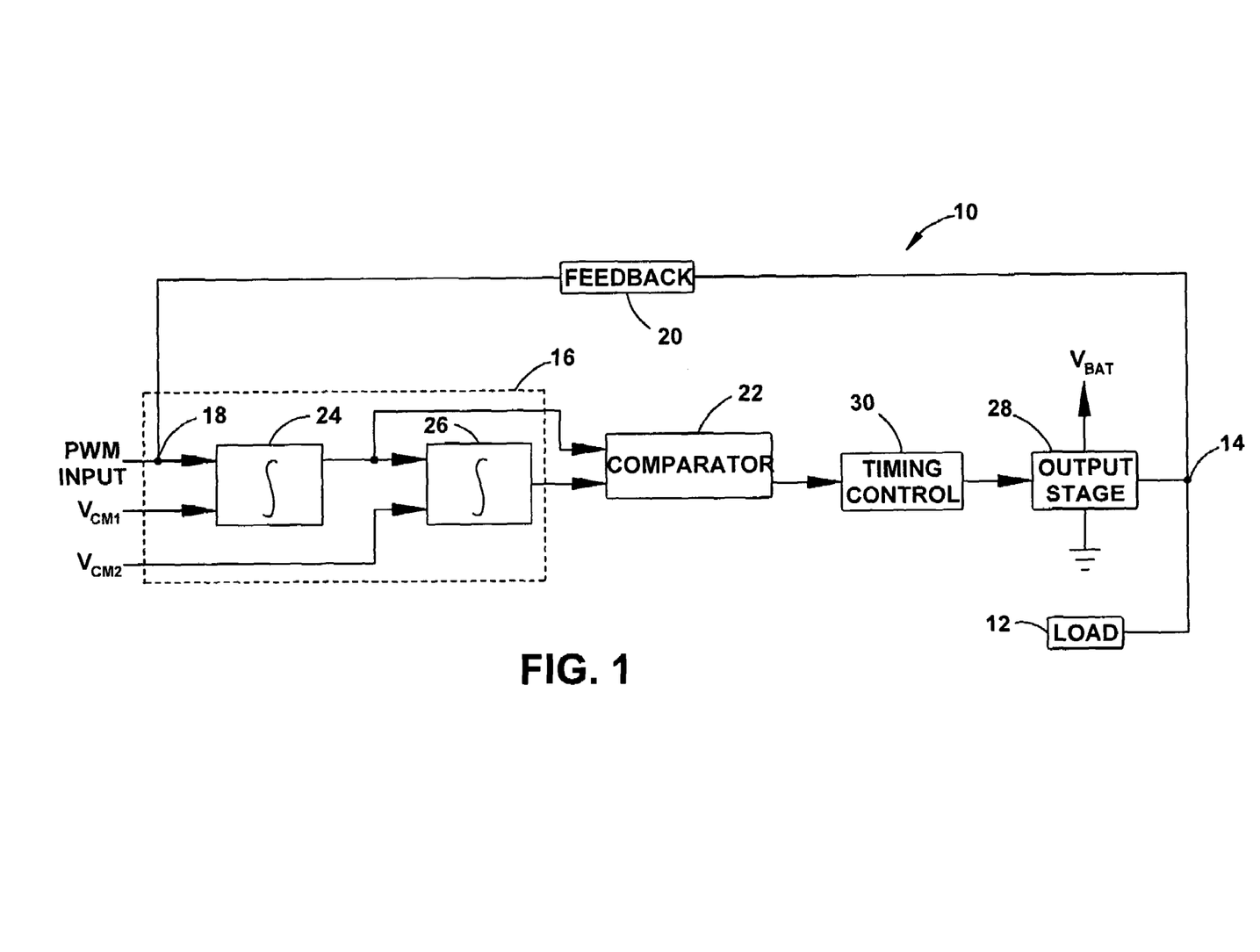
FIG. 1 illustrates an example of a Class-D type amplifier system in accordance with an aspect of the invention.

FIG. 1 depicts an example of an amplifier system 10 according to an aspect of the present invention. The amplifier system 10 is as a Class-D (or switching) amplifier that is operative to drive an associated load 12 by a pulse-width modulating (PWM) an output signal at an output 14. The amplifier system 10 includes an Nth order loop filter 16, where N is a positive integer greater than one (N>1). The filter 16 is configured to accept a digital PWM input signal at an input 18. While some existing architectures have been designed to work with digital PWM inputs, such approaches usually still require the presence of an analog ramp at the input of the comparator. The presence of an analog ramp at the input is undesirable since the presence of analog ramp can create intermodulation distortion because of the carrier modulating with the PWM input. Approaches to correct such intermodulation are generally expensive and difficult to achieve to a desired level of accuracy. Accordingly, the system 10 is configured to receive the digital PWM input signal at 18 in the absence of an analog ramp.

In the example of FIG. 1, the digital input signal, for instance, can be buffered or be directly provided from a PWM processor or other circuitry configured to provide a digital PWM signal for controlling the output 14 of the amplifier system 10. The signal at the output 14 is provided to the input 18 through a feedback path 20, such as may include a feedback resistance. Thus, the input signal at 18 provided to the loop filter 16 can correspond to an error signal; namely the difference between the input PWM signal and the amplifier output signal.

A comparator 22 compares output signals from the loop filter 16 to provide a quantized output signal corresponding to the PWM input signal provided at 18. In the example of FIG. 1, the loop filter 16 is formed of two integrators 24 and 26. The first integrator 24 integrates the error signal provided at 18 relative to a common mode voltage $V_{CM1}$. For instance, when the input signal at 18 is a PWM signal (e.g., a square-type waveform of varying duty cycle), the integrator 24 provides a generally triangular waveform output to the second integrator 26. In practice, however the output waveform tends to be substantially trapezoidal due to variations in the PWM input signal and the output signal, loop delay in the system as well as the common mode voltage $V_{CM1}$ being derived as a function of the an unregulated power supply. The output of the first integrator is provided to a first input of the comparator 22.

The second integrator 26 integrates the output from the first integrator to provide a corresponding integrated output signal to a second input of the comparator 22. When the first integrator output is a triangular waveform, for example, the second integrator output is a second order, non-linear output. The comparator 22 thus compares the respective outputs from the integrators 24 and 26 and provides the quantized output signal based on the comparison. The loop filter 16 and comparator ideally operate as a buffer such that the output PWM at 14 corresponds to a delayed version of the PWM input signal. The loop filter 16 further mitigates errors and noise associated with variations in the input supply voltage from the battery or other power supply. As a result, the quantized output signal has a pulse-width modulation for controlling an output stage 28 to provide the PWM output signal at 14.

A timing control block 30 can implement timing control relative to the quantized output signal and provide a PWM control signal to the output stage 28. The timing control block 30, for example, can include a combination of switch devices and logic gates that decodes the quantized output signal as well as controls the rising-edge and falling-edge dead time of the power stage transistors (e.g., power field effect transistors) as well as corrects timing asymmetry that other blocks in the PWM signal path might cause. The timing control block 30 provides the timing-compensated PWM control signals to the output stage 28. The output stage 28 in turn provides the output PWM signal to drive the load 12 based on the PWM control signal provided by the timing control block 30. The output stage 28 is connected between power rails, which in the example of FIG. 1 are depicted as the unregulated battery voltage ($V_{BAT}$) and electrical ground. Advantageously, the amplifier system 10 enables the output stage 28 to be directly connected to $V_{BAT}$ because the loop filter corrects for variations in $V_{BAT}$. Thus, the output stage modulates the output signal at 14 between $V_{BAT}$ and electrical ground. Additionally, from FIG. 1, it will be appreciated that an analog ramp signal is not required to generate the PWM control signal for control the power driver 24. The absence of an analog ramp generator helps improve performance (e.g., less intermodulation distortion) as well as reduces the area on the IC die for implementing the amplifier system 10.

Figure 2:
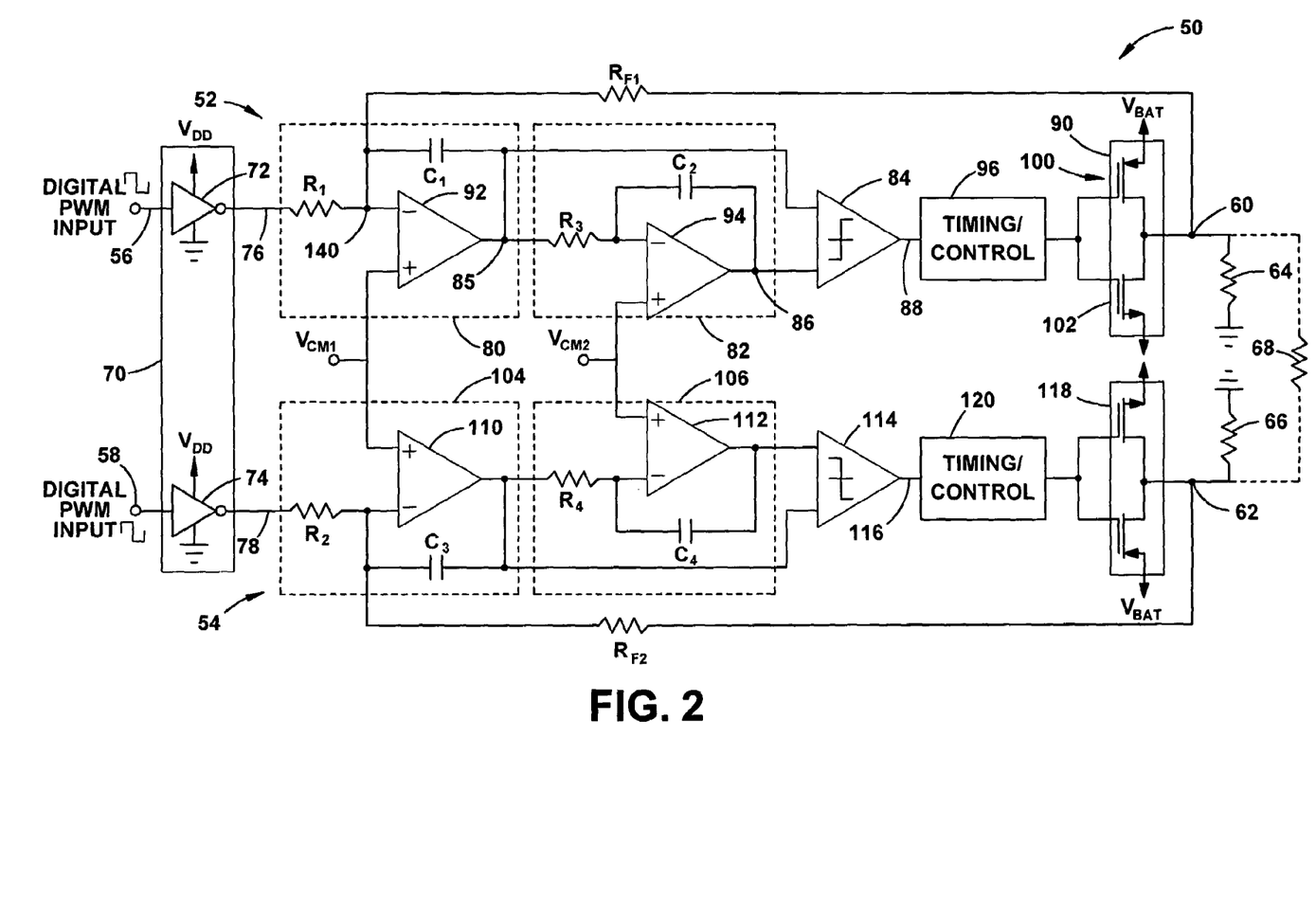
FIG. 2 illustrates another example of a Class-D type amplifier system in accordance with an aspect of the invention.

FIG. 2 depicts an example of another amplifier system 50 according to an aspect of the present invention. The amplifier system 50 includes a pair of amplifier channels 52 and 54, each of which includes an amplifier configured according to an aspect of the present invention. For example, each amplifier channel 52, 54 can operate independently based on respective digital PWM input signals provided at respective inputs 56 and 58. In such mode (e.g., a Class-AD mode), each of the amplifier channels 52 and 54 provides separate output signals at corresponding outputs 60 and 62 for driving respective loads 64 and 66, such as one or more loudspeakers (or speakers). Alternatively, the channels 52 and 54 can be operated in another mode (a Class-BD mode), such that the amplifiers drive a common (e.g., bridge tied) load, indicated at 68, based on PWM input signals provided at 56 and 58. As in other examples described herein, each of the loads 64, 66, 68 can include one or more loudspeakers, although other types of loads (e.g., motors) can also be driven by the amplifier system 50. Additionally, the amplifier system 50 can be employed to drive single-ended and differential loads.

To help isolate a digital PWM processor and other circuitry (not shown) from the amplifier system 50, the digital PWM input signals can be provided to a one-bit digital-to-analog converter (DAC) 70. For example, the one-bit DAC 70 for example includes a pair of buffers 72 and 74 that regulate the digital input PWM between high and low voltage rails, at least one of which being a regulated voltage (e.g., $V_{DD}$) and electrical ground. The buffers 72 and 74 thus mitigate voltage ripple and other noise that might otherwise be introduced on to digital PWM input signals. Each buffer 72, 74 provides a corresponding digital PWM input signal to an amplifier input 76, 78, such as having a pulse width commensurate with the digital PWM input signals and alternating between a substantially regulated voltage (e.g., $V_{DD}$ and electrical ground).

Each of the amplifier channels 52 and 54 can be configured similarly. For purposes of brevity, the channel 52 will be described followed by a summary discussion of the other channel 54 of the amplifier system 50. The amplifier channel 52 includes an Nth order loop filter, which in the example of FIG. 2 comprises a pair of integrators 80 and 82. The dual integrator loop filter 80, 82 drives a comparator 84. The comparator 84 compares a first integrator filter signal 85 with the output 86 of the loop filter (a second integrator filter signal) to provide a corresponding quantized output signal at a comparator output 88. The quantized output signal at 88 is a PWM signal that is utilized to control operation of an output stage 90.

Turning to the contents of the loop filter, the first integrator 80 includes an input resistor R1 connected between the buffer 72 and an input (e.g., an inverting input) of an operational amplifier (op-amp) 92. A feedback capacitor C1 is connected between the input and output of the op-amp 92. At the input of the op-amp 92, feedback from the output 60 is also supplied through a feedback resistor $R_{F1}$ so that an error signal is provided at the input of the op-amp 92. The error signal corresponds to the difference between the buffered input PWM signal (from the buffer 72) and the PWM output at 60. A first common-mode voltage $V_{CM1}$, is supplied to a non-inverting input of the op-amp 92. To mitigate variations associated with changes in $V_{BAT}$, the $V_{CM1}$, can be provided as a function of $V_{BAT}$, such as described below. The first integrator 80 thus integrates the error signal to provide a first integrated output signal 85 as both an input to the comparator 84 and to the second integrator 82.

Figure 3:
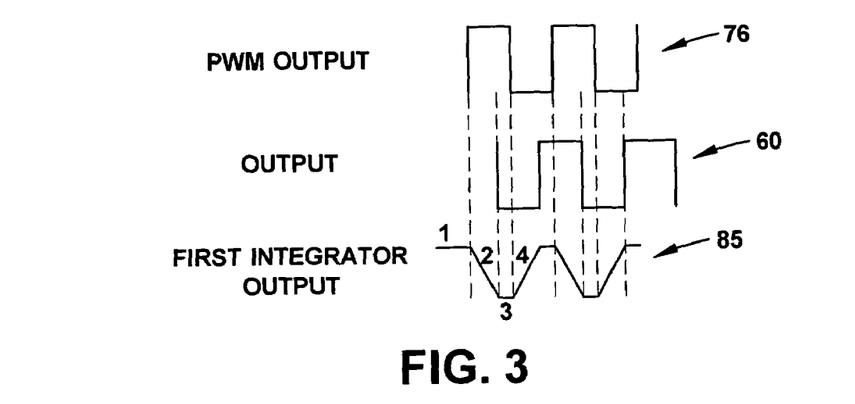
FIG. 3 illustrates an example of signals in an amplifier system operating in accordance with an aspect of the invention.

FIG. 3 depicts the relationship of signals in the amplifier channel 52 associated with the first integrator 80, including the output signal 85 of the first integrator for a PWM input at 76 and a corresponding amplifier output signal at 60. It is desirable to have no current in the feedback capacitor C1 during conditions 1 and 3 of the first integrator output 85. During condition 1, it can be shown that:

$$V_{CM1} = \frac{V_{BAT}}{\left(1 + \frac{R_{F1}}{R_1}\right)} \quad \text{Eq. 1}$$

During condition 3, it can also be shown that:

$$V_{CM1} = \frac{V_{DD}}{\left(1 + \frac{R_1}{R_{F1}}\right)} \quad \text{Eq. 2}$$

From Eqs. 1 and 2, it can be observed that conditions 1 and 3 result in the same common-mode value only when the following condition is true:

$$\frac{V_{BAT}}{V_{DD}} = \frac{R_{F1}}{R_1} \quad \text{Eq. 3}$$

Thus, to maintain the relationship of Eq. 3, either $R_{F1}$ (or $R_1$) should be adjusted whenever $V_{BAT}$ changes. Since the variation in $V_{BAT}$ is in continuous time and since $R_{F1}$ can be switched only in discrete steps, the adjustments become more complicated in real time. Another way of calculating the common-mode for the first integrator 80 is to examine at common-mode current equation, which can be represented as follows:

$$V_{CM1} = \frac{\frac{V_{DD}}{2}}{\left(1 + \frac{R_1}{R_{F1}}\right)} + \frac{\frac{V_{BAT}}{2}}{\left(1 + \frac{R_{F1}}{R_1}\right)} \quad \text{Eq. 4}$$

It can be observed that Eq. 4 is the average of Eqs. 2 and 3. Hence, $V_{CM1}$ can be implemented using Eq. 4. But Eq. 4 shows that $V_{CM1}$ is function of the battery voltage, which means that any nipple on the battery might manifest at the output with little suppression. This will be a direct hit on the PSRR of the system. In order to have a high PSRR, a sub-hertz low-pass filter can be utilized; although this scheme would involve a huge area over-head because of the low pole set by the RC filter.

Figure 4:
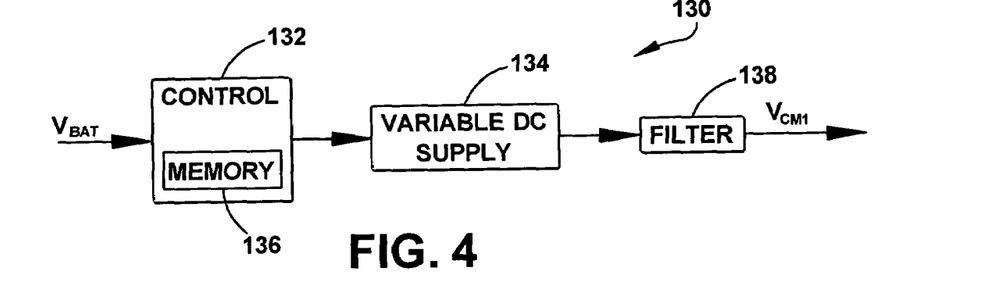
FIG. 4 depicts an example of a system for generating a common mode voltage in accordance with an aspect of the invention.

Another approach to set $V_{CM1}$ can be referred to as a "switchable common-mode." The switchable common mode approach employs Eq. 4 from a variable power supply or buffer that runs on a regulated power supply (e.g., $V_{DD}$). FIG. 4 depicts an example of a system 130 for generating a common mode voltage that can be implemented according to an aspect of the present invention. As shown in FIG. 4, the system 130 includes control circuitry (e.g., a digital signal processor) 132 that can monitor $V_{BAT}$. For instance, the control circuitry can correspond to a PWM processor that supplies the digital PWM input signals to the amplifier system 50. Different $V_{CM1}$, settings can be selected for a variable supply 134. The variable supply 134, for example, can be a multi-bit digital-to-analog converter (DAC) or other circuitry that can provide a substantially fixed DC output signal based on the control signal from the control circuitry 132. As an example, the control circuitry 132 includes memory (e.g., a look-up table) 136 that is programmed and/or configured to determine a selected value of $V_{CM1}$ based on $V_{BAT}$. The granularity of different settings for the common-mode $V_{CM1}$ will depend on the amount of offset that the system 50 can tolerate as well as other performance requirements of the amplifier system.

By way of further example, in a typical battery based system, the rate of change in battery voltage is in minutes. The DSP (or other existing circuitry, such as the control circuitry 132) present in these system can be used to obtain the battery reading and change the setting for the common-mode supply 134 through a control register (not shown), such as may include one or more bits. Those skilled in the art will understand and appreciate other implementations of circuitry that can be employed to generate $V_{CM1}$ as a function of $V_{BAT}$.

Table 1 lists an example of common-mode values for different battery settings. The example common mode values are provided for an example when the system 50 can tolerate a worst-case offset of about 40 mV, which can vary as a function of the design parameters of the system.

TABLE 1

| $V_{BAT}$ (V) | $V_{CM1}$ (V) |
|---|---|
| 4.80 | 0.82 |
| 4.45 | 0.79 |

TABLE 1-continued

| $V_{BAT}$ (V) | $V_{CM1}$ (V) |
|---|---|
| 4.15 | 0.76 |
| 3.85 | 0.73 |
| 3.50 | 0.70 |
| 3.10 | 0.67 |
| 2.70 | 0.64 |
| 1.80 | 0.57 |

For the example represented in Table 1, when $V_{BAT}$=4.8 V, the system 130 provides $V_{CM1}$ at 0.82 V and may remain so until $V_{BAT}$=4.46. When $V_{BAT}$ changes to 4.45, $V_{CM1}$ is updated to 0.79. Since this approach could cause click/pop noise at the output 60 when the common-mode is switched, the filter 138 can be configured as a low pass filter (the pole of this filter need not be low) to smoothen this effect and to reduce click/pop. Alternatively or additionally, the closed loop response of the loop filter (formed by integrators 80 and 82) operates similarly to a low pass filter with a pole at approximately 60 KHz, such that the filter 138 can be omitted from the system 130, if desired. Consequently, transients due to common-mode switching will be considerably damped by the loop filter 80, 82. Given that the change in battery voltage (and hence the switching of common-mode) usually occurs over a period of hours, the loop should reasonably suppress any click and pop effects due to common-mode switching. In the unlikely event that the switching causes a perceptible audio degradation, digital techniques for varying the input PWM switching can also be employed with very little or no area penalty. Alternatively, an optional filter (e.g., a low pass filter) 138 can be provided at the output of the supply 134 to mitigate noise from being introduced onto the $V_{CM1}$ when the $V_{CM1}$ is adjusted to different settings. That is, the filter 138 is optional.

Returning back to FIG. 2, the second integrator 82 includes an input resistor R3 coupled between the output of the first integrator 80 and an input of an op-amp 94, such that the first integrator output 85 is provided at an input (e.g., an inverting input) of the op-amp 94. A second common-mode voltage $V_{CM2}$ is provided to another input (e.g., a non-inverting input) of the op-amp 94. As one example, the common-mode $V_{CM2}$ for the second integrator 82 can be set as a function of a regulated voltage (e.g., $V_{DD}$/2) to realize for high dynamic range at the output of the second integrator 82. The first integrator output swings around the common-mode $V_{CM2}$ of the second integrator 94. A feedback capacitor C2 is connected between the input and output of the op-amp 94. The integrator 82 thus integrates the output of the first integrator to provide the corresponding loop output at 86. The comparator 84 compares the first and second integrator outputs 85 and 86, respectively, to provide the quantized output signal at 88.

The quantized output signal at 88 is employed to control switching of the output stage 90, such as described herein. A timing/control block 96 can implement timing control relative to the quantized output signal 88 and provide a corresponding timing-compensated PWM control to the output stage 90. Those skilled in the art will understand and appreciate various types of timing/control circuitry that can be utilized to implement appropriate control of switching devices in the output stage as well as to correct timing asymmetry that other circuitry in the PWM signal path might cause.

As mentioned above, the output stage 90 is coupled to drive a load 64 or 68 that is connected at the output 60. In the example of FIG. 2, the output stage 90 includes a half bridge arrangement, although other types and configurations of circuitry can be utilized as the output stage 90. The output stage 90 includes a high-side FET (e.g., a p-channel FET) 100 that is connected directly between $V_{BAT}$ and the output 60 (e.g., source of FET 100 connected to $V_{BAT}$ and drain connected to 60). A low-side FET (e.g., an n-channel FET) 102 is connected between the other rail, which in this example is electrical ground, and the output. While a common PWM control signal is shown as being provided to FETs 100 and 102, it is to be understood that separate control signals can be utilized to drive different parts of the output stage 90, which signals may vary depending on the types of switch devices and configuration of the output stage 90.

The second channel 54 of the amplifier system 50 can be configured similarly to the first channel described above. Briefly stated, an input 78 of a loop filter receives the input PWM signal from the buffer 74. The loop filter includes a first integrator 104 and a second integrator 106. The first integrator 104 includes an input resistor $R_2$ connected between the input 78 and a first input 140 of an op-amp 108. A feedback capacitor C3 (e.g., C3=C1) connected between the output and the first input 140 of the op-amp 108. The second channel 54 also includes a feedback resistance $R_{F2}$ connected between the output 62 and the input 140 of the op-amp 110. $V_{CM1}$ is provided to another input of the op amp 108. The second integrator 104 includes an input resistor $R_4$ connected between the output of the first integrator 104 and an input of an op-amp 112. The resistor $R_4$ operates to create a zero for the transfer function (e.g., two pole and one zero) system being implemented. A feedback capacitor C4 (e.g., C2=C4) is connected between the input and output of the op-amp 112. $V_{CM2}$ is provided to the second input of the op-amp 112. It is to be understood that the loop filter 104, 106 of the second channel can be configured differently from the loop filter of the second channel and that different integrator configurations could also be implemented from those shown and described herein to provide the Nth order loop filter.

Each of the integrators 104 and 106 provides corresponding integrator output signals as inputs to a comparator 114. The comparator 114 provides a quantized output signal at an associated output 116 based on a comparison of the integrator output signals. The quantized output signal is PWM signal (e.g., modulated between $V_{DD}$ and electrical ground) that is used to control an output stage 118 of the second amplifier channel 54. A timing control block 120 can implement timing adjustment to provide a timing-compensated PWM control signal to the output stage 118. As in the first amplifier channel 52, the output stage 18 can be implemented as a half bridge that includes a high-side FET (e.g., a PMOS device) 122, which is connected between VBAT and the output 62, and a low-side FET (e.g., an NMOS device) 124 connected between the output and electrical ground (or other low voltage rail).

Figure 5:
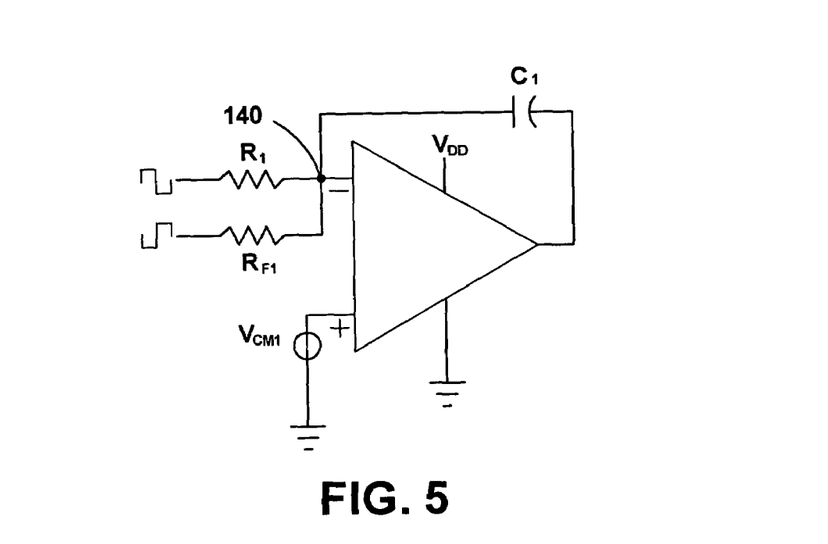
FIG. 5 illustrates an example of part of the amplifier system of FIG. 2 for use in determining a feedback resistance for use in an amplifier system in accordance with an aspect of the invention.

The feedback resistor $R_{F1}$, $R_{F2}$ for each amplifier channel can be determined from current analysis at the input of the first op-amp 92, 110. For purposes of brevity, the following description relates to selecting $R_{F1}$, for the first channel 52, the concept of which can be employed to determine $R_{F2}$. FIG. 5 thus depicts pertinent connections at the input 140 of the first op-amp 92 from FIG. 2. From current analysis (Kirchoff's Current Law) at the input 140, RF1 can be expressed as follows:

$$R_{F1} = \left(\frac{V_{BAT}}{V_{DD}}\right) \times R_1 \qquad \text{Eq. 5}$$

As mentioned above, as with any battery-operated system, $V_{BAT}$ varies with respect to time. As a result, to maintain the relationship of Eq. 5, $R_1$ would need to be changed based on $V_{BAT}$. This would entail the use of switches in the feedback path, however, which would increase the complexity of the design and the ultimate cost of the amplifier system 50. Thus, it has been determined that $R_{F1}$ can be fixed if $R_{F1}$ is chosen as a function of a maximum $V_{BAT}$ ($V_{BAT,MAX}$), a minimum $V_{DD}$ ($V_{DD,MIN}$) and $R_1$ for example, such that:

$$R_{F1} \geq \left(\frac{V_{BAT,MAX}}{V_{DD,MIN}}\right) \times R_1. \qquad \text{Eq. 6}$$

The $V_{BAT,MAX}$ and $V_{DD,MIN}$ can be determined from simulations of the design or based on empirical testing for the amplifier system 50. $V_{BAT,MAX}$ also will depend on the type of battery being used in the amplifier system 50. The feedback resistor $R_{F2}$ in the second amplifier channel 54 can be selected in a similar manner; namely as a function of a maximum $V_{BAT}$, a minimum $V_{DD}$ and $R_2$.

Figure 6:
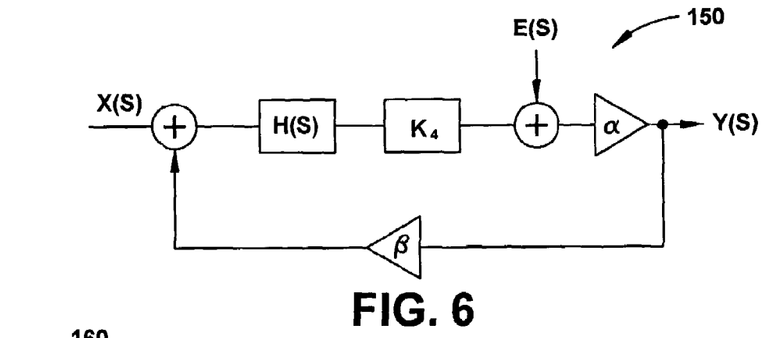
FIG. 6 illustrates a transfer function representation of the system of FIG. 1 in accordance with an aspect of the invention.

FIG. 6 depicts a linearized model 150 of an Nth order Class-D amplifier system 150 that can be implemented according to an aspect of the present invention. The Nth order loop-filter is represented by H(s) and the comparator (e.g., a single bit quantizer) is modeled as a simple gain element ($K_q$) followed by an additive noise source E(s). The output stage is modeled as a linear gain of $\alpha$ (since the loop delay is of the order of nanoseconds (ns)) and the feedback path is denoted by $\beta$. In the model, 150, the change in the battery voltage will also change $\alpha$ proportionally.

The amplifier system 150 is characterized by the signal transfer function (STF) and the error transfer function (ETF), while the loop-filter can be characterized by the system's open loop transfer function (OTF). Good error suppression will be obtained by maximizing the loop-filter gain in the audio band and the error suppression is equal to the loop-filter gain. The following equations describe the OTF, STF and the ETF of the system.

$$OTF = K_q \alpha H(s) \qquad \text{Eq. 7}$$

$$STF = \frac{K_q \alpha H(s)}{1 + K_q \alpha \beta H(s)} \qquad \text{Eq. 8}$$

$$ETF = \frac{1}{1 + K_q \alpha \beta H(s)} \qquad \text{Eq. 9}$$

The loop-filter H(s) is a second order loop-filter and can be mathematically expressed as follows:

$$H(s) = \frac{K_1}{\left(\frac{s}{p_1}+1\right)} + \frac{K_1 K_2}{\left(\frac{s}{p_1}+1\right)\left(\frac{s}{p_2}+1\right)} \qquad \text{Eq. 10}$$

where $p_1$ and $p_2$ are the poles of the first and second integrators and $K_1$ and $K_2$ are the DC gains of the respective integrators. The higher the $K_1$ and $K_2$, the higher will be the suppression. As an example, typical dc-gain is in the order of approximately 90 dB.

A steady-state response of the filter further can be expressed as follows:

$$y(t) = K_1 \times (1 - e^{-p_1 t}) + K_1 K_2 \times \left[\frac{1 + (p_2 e^{-p_1 t} - p_1 e^{-p_1 t})}{p_1 - p_2}\right] \qquad \text{Eq. 11}$$

From examination of the Taylor's series expansion for the steady state response and neglecting the higher order terms in Eq. 11 (since the loop-delay is in the order of ns, all higher order terms can be neglected) to provide the following approximation:

$$y(t) \cong K_1 p_1 t \qquad \text{Eq. 12}$$

From the approximation of Eq. 12, a maximum loop filter amplitude (A) can be expressed as follows:

$$A = K_1 p_1 t_d \qquad \text{Eq. 13}$$

where $t_d$=loop delay of the system.

The loop delay $t_d$ of the system is set by the gate-drivers utilized to drive the power-FETs in the output stage of the amplifier system. Once the input changes, the loop filter begins changing with an approximately linear slope. After the filter output crosses zero (or the value of the first integrator), the comparator changes states of the quantized output signal. This state transition manifests at the output after the time delay of $t_d$. During the loop delay time $t_d$, the loop filter output maintains a substantially linear change, with the total switching time being approximately $2t_d$.

Referring back to the first channel 52 of FIG. 2, from Eq. 13, the loop-filter maximum amplitude can defined as follows:

$$A = \frac{2 K_1 t_d}{(1+K_1) R_1 C_1} \cong \frac{2 t_d}{R_1 C_1} \qquad \text{Eq. 14}$$

It may be observed that higher performance can be achieved as error signal lessens. Hence, it is desirable to minimize the loop-filter amplitude (as well as the associated loop-delay). As an example, assuming a worst-case delay of about 20 ns ($t_d$=20 ns) and a maximum amplitude A=15 mV, the passive components ($R_1$ and $C_1$) of the first integrator 92 can be determined. The second integrator pole further can be set in such a way that the system has a phase-margin of approximately 60°. Under these conditions, the following relationship exists between components in the first and second integrators:

$$R_3 C_2 = \sqrt{3} R_1 C_1 \qquad \text{Eq. 15}$$

Figure 7:
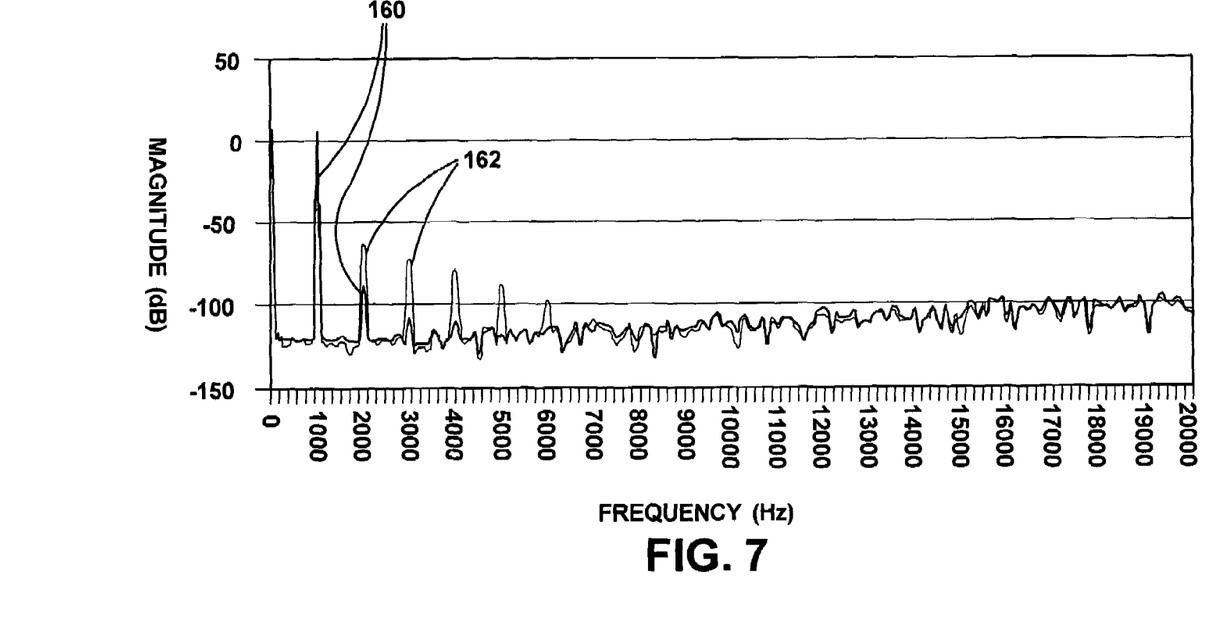
FIG. 7 is a graph depicting a comparison of an open loop response and a closed loop response for an amplifier system in accordance with an aspect of the invention.

FIG. 7 is a graph of magnitude plotted as a function of frequency depicting a comparison between closed loop total harmonic distortion (THD), indicated at 160, and closed loop THD, indicated at 162, for an amplifier system implemented in accordance with an aspect of the present invention. In FIG. 7, the open and closed loop THD 162 and 160 are substantially the same at the fundamental frequency. However, from FIG. 7, it is shown that the second and third order harmonics for the closed loop THD 160 are significantly suppressed (e.g., near the noise floor) relative to the open loop THD 162. The reduction in THD for the order closed loop (Nth order loop) demonstrates the effect of the loop in mitigating non-linearities associated with power being supplied directly from the battery.

Figure 8:
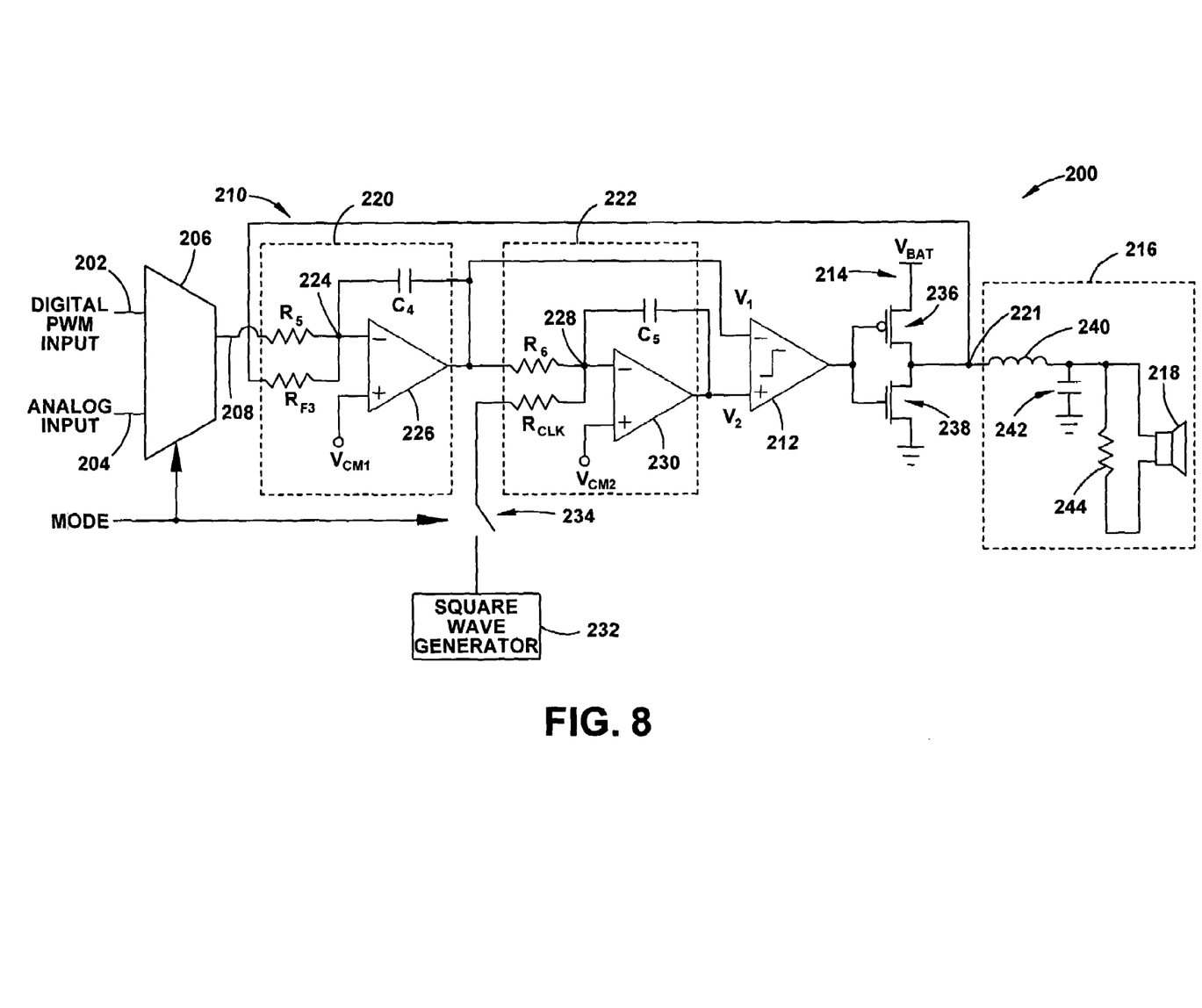
FIG. 8 illustrates an example of a reconfigurable type of amplifier system in accordance with an aspect of the present invention.

FIG. 8 depicts an example of a reconfigurable amplifier system 200 that can be implemented in accordance with an aspect of the present invention. The reconfigurable amplifier system 200 can receive a digital input PWM signal, an analog input signal or a combination of digital and analog input signals at respective inputs 202 and 204. The system 200 includes a selector (e.g., a multiplexer or other switching system) 206 that is configured to select which input or inputs is to be provided as a corresponding input, at 208, to a filter network 210. For example, the selection of the input signal(s) can be made according to a MODE signal, which can be provided by associated control circuitry (e.g., a DSP or controller, not shown).

The filter network 210 comprises a loop network, such as an Nth order loop as described herein, which provides corresponding outputs, indicated at V1 and V2, to a comparator 212. The comparator 212 compares the respective outputs V1 and V2 and provides a corresponding quantized output signal based on the comparison. The quantized output signal thus is provided as a PWM output signal that is employed to control activation of an output stage 214. The output stage 214 can be coupled between $V_{BAT}$ and a low voltage rail, such as electrical ground, as shown in FIG. 8. The output stage thus provides a PWM output signal that modulates between $V_{BAT}$ and electrical ground for driving an associated load 216 based on the quentized output signal. The load 216 can include one or more speakers 218. The filter network 210 is configured to mitigate the effects of variation in $V_{BAT}$, such as described herein.

The filter network 210 can be similarly configured to other Nth order loop filters described herein. Briefly stated, the filter network can be a two (or more) integrator loop filter that includes first and second integrators 220 and 222. The first integrator 220 receives an error signal at a first (e.g., an inverting) input thereof 224. The error signal corresponds to a difference between the selected input at 208 and an output signal fed back from an output 221 of the amplifier system 200 through a feedback resistor $R_{F3}$. The first integrator 220 integrates this error signal to provide an integrated output signal V1. The first integrator 220 includes an input resistor R5 connected at a first input 224 of an op-amp 226. A feedback capacitor C5 is connected between the output and the input of the op-amp 226. A common mode voltage $V_{CM1}$ is provided to another (e.g., the non-inverting) input of the op amp 226. $V_{CM1}$ can be fixed or selectively variable, as described herein.

The second integrator 222 includes an input resistor R6 connected between the output of the first integrator 220 and an input 228 of a second op-amp 230. A feedback capacitor C5 is connected between the input 228 and output of the op-amp 230. A square wave generator 232 is also coupled to the first input 228 through a switch device 234 and a resistor, indicated at $R_{CLK}$. The square wave generator provides a square wave input signal to the input 228 based on the state of the switch device 234. The state of the switch device 234 depends on the operating mode of the amplifier system 200, such as can be indicated by the MODE signal. For example, if the system 200 is operating in a digital mode, the switch device 234 can be activated to a first state (e.g., an open or non-conductive state) so that the square wave generator does not provide the square wave to the input 228. If the systems 200, is operating in an analog mode, such that the amplifier 200 is driver by an analog input, the switch device 234 can be activated to a second state (e.g., a closed conductive state) in which the square wave generator 232 provides the square wave to the input 228. While the switch device 234 is depicted as being external to the square wave generator 232, it is to be understood that the square wave generator could itself include the switch device or other means for selectively providing the square wave to the input 228, such as according to the operating mode. The square wave generator 232 can be configured to provide the square wave at substantially the same fundamental frequency as the input PWM signal. $V_{CM2}$ is provided to the second (e.g., non-inverting) input of the op-amp 230.

By way of example, components in the reconfigurable amplifier architecture 200 can be configured to provide appropriate operation for both linear and digital modes. Design equations for the components $R_5$, $R_6$, $R_{CLK}$ can be as follows:

$$R_5 = \frac{G_{PWM}}{2\pi f_{ug} C_4} \qquad \text{Eq. 16}$$

$$R_6 = \frac{\sqrt{3} R_5 C_4}{G_{PWM} C_5} \qquad \text{Eq. 17}$$

$$R_{CLK} = \frac{V_{CLK}}{4 f_{sw} C_5 V_2} \qquad \text{Eq. 18}$$

$$G_{PWM} = \frac{V_{BAT}}{V_2} \qquad \text{Eq. 19}$$

where: $G_{PWM}$ is the PWM output gain (a design parameter based on desired output swing;

$f_{ug}$ is the unity gain frequency of the first integrator 220;

$f_{sw}$ is the PWM switching frequency or, alternatively, the carrier frequency; and $V_{CLK}$ is the amplitude of the input clock signal provided by the square wave generator 232. The feedback resistance $R_{F3}$ can be determined in a manner similar to as shown and described with respect to Eq. 6.

The second integrator 222 thus either integrates an integrated output signal from the first integrator 220 (in the digital mode) or a substantially square wave from the square wave generator 232 (in the analog mode). The first integrator output is provided to the non-inverting input of the comparator 212, which in the analog mode typically corresponds to a sinusoidal signal. The second integrator 22 thus provides a corresponding output to the inverting input of the comparator 212. In the analog mode, the comparator 212 compares a substantially triangular or ramp waveforme (V2) with a sinusoidal analog input waveform V1 to provide the quantized output signal. In the digital mode, the loop filter signals V1 and V2 are substantially the same as described above (FIG. 2). The comparator 212 in turn drives the output stage 214 with the quantized output signal. For example, the quantized output signal varies between voltage rails provided to the comparator, such as a regulated voltage (e.g., $V_{DD}$) and electrical ground. Additionally, while timing/control logic has not been depicted in the example of FIG. 8, suitable timing/control logic could be implemented between the comparator 212 and the output stage, such as shown and described in FIG. 2.

Similar to the example of FIG. 2, the output stage 214 includes a half-bridge of transistor devices 236 and 238 connected between voltage rails, such as an unregulated $V_{BAT}$ and electrical ground. The output stage 214 thus provides a corresponding output that is modulated between the respective voltage rails as a function of the quantized output signal. In the example of FIG. 8, the load 216 is depicted as one or more speakers, which can be modeled as including an inductor 240 connected with a capacitor 242 and a resistor 244, representing impedance of one or more speakers connected as a singled ended load. The particular values of such components will vary according to the type and configuration of the load 216 in a given application.

While the example of FIG. 8 is depicted as including a single amplifier channel, it is to be understood and appreciated that the amplifier system 200 can be extended to a multi-channel implementation, such as may include any number of two or more channels. In such an implementation, the selector 206 could be configured to selectively propagate a digital or analog input for each of the respective channels. For instance, a bit can be applied to the selection 206 for each channel, with the state of each bit controlling propagation of the analog or digital input through the selector and into the input of the loop filter. The same square wave generator can be employed to drive the second integrator in the analog mode for each respective channel. Alternatively, separate square wave generators can be used for more than one of the channels. Similar to the approach shown and described in FIG. 2, each channel of such a multi-channel system can be configured with a single-ended load or, alternatively, a bridge-tied load could be implemented between a pair of respective channels. In a bridge-tied configuration, one channel controls or drives the plus side input and the other channel controls or drives the minus side input of the load.

In view of the foregoing, a Class-D architecture can be provided that can support both digital channels as well as more traditional analog implementations of analog amplifiers. In addition to such increased versatility, the approach further enables direct battery hook-up for both analog and digital inputs, such that the overall cost of the amplifier system may be reduced relative to many existing approaches. It will be further appreciated that for a given set of performance parameters significantly smaller die area can be utilized for the set of passive components in a digital implementation than corresponding analog implementation. The approach thus provides a major improvement for implementing PWM in digital CMOS processes. For example, it will be appreciated that, for a given set of performance parameters, the die area required for the passive components in the amplifier system 200 (e.g. in FIG. 8) is significantly smaller when the amplifier is configured for digital operation than when configured for analog operation.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A Class-D amplifier system comprising:
    an input stage that includes a $N^{th}$ order filter, where N>1, the input stage filtering an input signal to provide a filtered output signal, an input of the input stage configured to receive the input signal as a digital pulse-width-modulated (PWM) signal;
    a comparator that provides a quantized output signal based on the filtered output signal;
    an output stage connected between a first voltage rail and a second voltage rail, the output stage providing a switching output signal at an output that varies between the first voltage rail and the second voltage rail based on the quantized output signal; and
    a feedback path that connects the output of the output stage with the input of the input stage, such that the $N^{th}$ order filter compensates for variations in at least one of the first voltage rail and the second voltage rail.

2. The system of claim 1, wherein the first voltage rail comprises an unregulated battery voltage.

3. The system of claim 1, wherein the input stage further comprises:
    a first integrator that integrates the digital PWM input signal to provide a corresponding first integrated output signal; and
    a second integrator that integrates the first integrated output signal from the first integrator to provide a corresponding second integrated output signal that defines the filtered output signal, the comparator providing the quantized output signal based on a comparison of the first integrated output signal and the second integrated output signal.

4. The system of claim 3, wherein the first integrator further comprises an input resistor coupled between the digital PWM input signal and a first input of the first integrator, the feedback path comprising a resistance coupled between the output of the output stage and the first input of the first integrator, the resistance of the feedback path being configured as a function of a maximum voltage potential across the first and second rails and the input resistance.

5. The system of claim 3, wherein the first integrator comprises first and second inputs, the digital PWM input signal being provided to the first input of the first integrator, a first common mode voltage being provided to the second input of the first integrator; and
    wherein the second integrator comprises first and second inputs, the first integrator output signal being provided to the first input of the second integrator and a second common mode voltage being provided to the second input of the second integrator.

6. The system of claim 5, further comprising a system configured to generate the first common mode voltage that selectively varies as a function of the first voltage rail.

7. The system of claim 1, wherein the output stage further comprises a half-bridge connected between the first voltage rail and the second voltage rail.

8. The system of claim 1, further comprising:
    a selector that is configured to receive the digital input signal and an analog input signal, the selector selectively providing, as the input signal to the input of the input stage, one of the digital input signal and the analog input signal based on a mode signal that indicates operation of the amplifier system in one of a digital mode and an analog mode; and
    a square wave generator connected to selectively provide a square wave to the Nth order filter when in the analog mode.

9. The system of claim 8, wherein the input stage further comprises:
    a first integrator that integrates the input signal at the input of the input stage to provide a corresponding first integrated output signal; and
    a second integrator that includes a first input that receives the first integrated output signal from the first integrator when in the digital mode and the square wave from the square wave generator when in the analog mode, the second integrator providing a corresponding second integrated output signal that defines the filtered output signal, the comparator providing the quantized output signal based on the first integrated output signal and the second integrated output signal.

10. The system of claim 9, wherein the first voltage rail comprises an unregulated battery voltage.

11. The system of claim 1, further comprising at least one speaker connected at the output of the output stage.

12. An audio amplifier system comprising:
an Nth order loop filter, where N>1, configured to integrate an error signal functionally related to a difference between an input signal representing an audio signal and a feedback signal corresponding to an output signal of the audio amplifier system, the loop filter providing at least one corresponding integrated output signal;
a comparator that provides a guantized outout signal based on the at least one corresponding integrated output signal;
an output staae connected between a first voltage rail and a second voltage rail, at least one of the first voltage rail and the second voltage rail being an unregulated voltage, the output stage modulating the output signal between the first voltage rail and the second voltage rail based on the quantized output signal, wherein the loop filter further comprises:
a first integrator that integrates the error signal to provide a corresponding first integrated output signal at an output of the first integrator; and
a second integrator provides a corresponding second integrated output signal that defines a corresponding second integrated output signal, the comparator providing the quantized output signal based on a comparison of the corresponding first integrated output signal and the corresponding second integrated output signal.

13. The system of claim 12, wherein the first integrator comprises first and second inputs, the error signal being provided to the first input of the first integrator, a first common mode voltage being provided to the second input of the first integrator; and
wherein the second integrator comprises first and second inputs, the output of the first integrator being connected to provide the corresponding first integrated output signal to the first input of the second integrator and a second common mode voltage being provided to the second input of the second integrator.

14. A The system of claim 13, further comprising a system configured to generate the first common mode voltage that varies as a function of the first voltage rail.

15. The system of claim 13, further comprising:
a selector that is configured to receive a digital pulse-width modulated (PWM) input signal and an analog input signal, the selector selecting as the input signal of the loop filters one of the digital PWM input signal and the analog input signal based on an operating mode of the amplifier system in one of a digital mode and an analog mode; and
a square wave generator system configured to selectively provide a square wave to the first input of the second integrator when the amplifier system is in the analog mode.

16. The system of claim 12, wherein the output stage further comprises a half-bridge connected between the first voltage and the second voltage rail.

17. An audio amplifier system comprising:
means for integrating an error signal functionally related to a difference between an input audio signal and a feedback signal corresponding to an output signal at an output of the audio amplifier system, and for providing an first signal at first output and a second integrated output signal at a second output of the means for integrating;
means for comparing the first signal and the second integrated signal to provide a quantized output signal; and
means for modulating the output signal between a first unregulated voltage and a second voltage based on the quantized output signal.

18. The system of claim 17, wherein the means for integrating further comprises:
first means for integrating the error signal to provide a first integrated output signal at an output thereof corresponding to the first signal; and
second means for integrating the first integrated output signal to provide the second integrated output signal, the means for comparing providing the quantized output signal based on a comparison the first integrated output signal and the second integrated output signal.

19. The system of claim 18, further comprising:
means for selecting as the input audio signal one of a digital PWM input signal and an analog input signal based on an operating mode of the audio amplifier system in one of a digital mode and an analog mode; and
means for selectively providing a square wave to the second means for integrating when the audio amplifier system is in the analog mode, such that the second means for integrating integrates the square wave to provide the second integrated output signal when the audio amplifier system is in the analog mode.

* * * * *